(12) United States Patent
Curran

(10) Patent No.: US 7,011,299 B2
(45) Date of Patent: Mar. 14, 2006

(54) LIQUID VAPOR DELIVERY SYSTEM AND METHOD OF MAINTAINING A CONSTANT LEVEL OF FLUID THEREIN

(75) Inventor: William J. Curran, Saratoga, CA (US)

(73) Assignee: Matheson Tri-Gas, Inc., Longmont, CO (US)

( * ) Notice: Subject to any disclaimer, the term of this patent is extended or adjusted under 35 U.S.C. 154(b) by 33 days.

(21) Appl. No.: 10/663,123

(22) Filed: Sep. 16, 2003

(65) Prior Publication Data
US 2004/0124549 A1    Jul. 1, 2004

Related U.S. Application Data

(60) Provisional application No. 60/411,026, filed on Sep. 16, 2002.

(51) Int. Cl.
*B01F 3/04*    (2006.01)
(52) U.S. Cl. .................... 261/66; 261/121.1; 261/127; 261/DIG. 65
(58) Field of Classification Search ............... 261/66, 261/69.1, 121.1, 122.1, 127, 142, DIG. 65
See application file for complete search history.

(56) References Cited

U.S. PATENT DOCUMENTS

| | | | |
|---|---|---|---|
| 3,826,560 A | 7/1974 | Schultz | |
| 3,987,133 A * | 10/1976 | Andra | 261/130 |
| 4,072,613 A * | 2/1978 | Alig | 210/198.1 |
| 4,235,829 A | 11/1980 | Partus | |
| 4,276,243 A | 6/1981 | Partus | |
| 4,299,116 A * | 11/1981 | Baillie et al. | 73/30.04 |
| 4,407,152 A * | 10/1983 | Guth | 73/1.03 |
| 4,436,674 A * | 3/1984 | McMenamin | 261/64.3 |
| 4,540,162 A * | 9/1985 | Gozlan | 266/146 |
| 4,582,480 A | 4/1986 | Lynch et al. | |
| 4,859,375 A | 8/1989 | Lipisko et al. | |
| 4,904,419 A | 2/1990 | Reynolds | |
| 5,035,200 A * | 7/1991 | Moriyama et al. | 118/693 |
| 5,520,858 A * | 5/1996 | Yamaguchi et al. | 261/130 |
| 6,135,433 A * | 10/2000 | Nurmi | 261/128 |
| 6,161,398 A * | 12/2000 | Partus | 65/379 |
| 6,220,091 B1 | 4/2001 | Chen et al. | |
| 6,746,002 B1 * | 6/2004 | Jones | 261/64.4 |

* cited by examiner

*Primary Examiner*—Scott Bushey
(74) *Attorney, Agent, or Firm*—Kent A. Lembke; Hogan & Hartson L.L.P.

(57) ABSTRACT

In accordance with the present invention, a method and system is described for controlling the delivery of vapor from a bubbler containing a supply of chemical fluid through which a carrier gas is bubbled and from which bubbler vapors are delivered in a vapor stream entrained with the carrier gas. In general, the present invention involves equilibrating the pressure within the head space to that of the chemical fluid fill line, thus maintaining a constant fluid level based on pressure and not relying on conventional level sensors and controllers.

15 Claims, 2 Drawing Sheets

LIQUID VAPOR DELIVERY SYSTEM AND METHOD OF MAINTAINING A CONSTANT LEVEL OF FLUID THEREIN

CROSS REFERENCE TO OTHER APPLICATIONS

This application claims the benefit of U.S. provisional application No. 60/411,026 filed Sep. 16, 2002 which is incorporated herein by reference.

BACKGROUND OF THE INVENTION

1. Field of the Invention

This invention relates to liquid vapor delivery systems of the type employing bubblers and to methods of maintaining constant levels of reagent within bubblers.

2. Description of the State of Art

The semiconductor industry is very dependent upon sources of ultrahigh purity reagents. Other industries also have high purity requirements, but few compare with the purity requirements in the semiconductor industry. Liquid vapor delivery systems are used in a number of manufacturing processes. For example, liquid vapor delivery systems are used in the manufacture of optical wave-guides. Such systems are described in U.S. Pat. Nos. 3,826,560; 4,235,829; and 4,276,243, the disclosures of which are incorporated herein by reference. Thin films are sometimes produced by liquid vapor delivery system technology, see HANDBOOK OF THIN FILM TECHNOLOGY, Maissel and Glang, McGraw-Hill, New York, 1970. Film deposition techniques are generally described, as applicable to the semiconductor industry, in ENCYCLOPEDIA OF SEMICONDUCTOR TECHNOLOGY, Grayson (Ed) John Wiley, New York, 1984.

With particular application to the manufacture of semiconductor films and devices, it is known to provide semiconductor devices by reacting a silicon wafer, appropriately prepared with the semiconductor component pattern thereon, with the vapor from chemical liquid vapor source materials or dopants. Among these chemical vapor source materials are boron tribromide, phosphorous oxychloride, phosphorous tribromide, silicon tetrachloride, dichlorosilane, silicon tetrabromide, arsenic trichloride, arsenic tribromide, antimony pentachloride and various combinations of these. In the compound semiconductor industry, epitaxial III–V semiconductor films are commonly grown by metalorganic chemical vapor deposition (MOCVD) using liquid vapor source materials such as trimethylgallium, triethylgallium, trimethylaluminum, ethyldimethylindium, tertiary-butylarsine, tertiary-butylphosphine, and other liquid sources. Many II–VI compound semiconductor films are also fabricated using liquid sources.

A common technique used in vapor generating systems for delivering chemical vapor to a process chamber is to force a carrier gas to bubble through a chemical fluid in a bubbler and then deliver the resulting vapor from the bubbler to the process chamber. Traditional bubblers, including those utilized in presently available automatic refill systems, rely on relatively large fluid volumes to intrinsically compensate for deviations in fluid level which can negatively effect the resulting vapor concentration. Since vapor sources in the fiber optics and semiconductor industries are often hazardous fluids, there has been an increasing focus on the occupational safety and health concerns resulting from use of such fluids. This has resulted in reducing the maximum allowable volumes of many of these fluids within the work place. It is therefore desirable to reduce the required fluid volume at the point of vapor generation without compromising vapor concentration control.

Those familiar in the art recognize that absolute values of vapor delivered are not the prime importance, but the consistency of the vapor concentration is of utmost importance. Hence the value of source material delivered per unit of time is more important than source material delivered per unit of carrier gas. Therefore, temperature and carrier gas residence time (liquid level) become the prime variables in determining consistency.

Typically a bubbler container is comprised of a single vessel, which holds an expendable volume of vaporizable fluid. A carrier gas such as hydrogen, oxygen, argon, helium or nitrogen is introduced at the lower level of a fluid column, travels up through, and exits the fluid surface into a headspace. As the carrier gas passes through the fluid column it becomes entrained with vapor, which results in a corresponding reduction of the fluid volume. In some applications such decreases in the level of liquid within the bubbler would have little effect. In other applications, however, such as in vapor deposition procedures employed in constructing semiconductors and optical fiber preforms, significant variations in the level of liquid have a pronounced adverse effect. This is attributable to the fact that the rate of vaporization is not solely dependent upon the surface area of liquid within the bubbler which area can, of course, be maintained constant as by the use of cylindrically shaped vessels. The vaporization rate here however is also dependent upon several other factors including the flow characteristics of carrier gas bubbled through the liquid. For example, the size of the bubbles as they rise through the liquid has an effect on the rate of vaporization. The rate of flow of the carrier gas introduced into the bubbler itself has another effect on the rate of vaporization as also does the rise time of the bubbles, which, of course, depends on the depth at which they are introduced. The rate of heat transfer into the bubbler will also be affected by changes in the level of liquid. While theoretically possible to program a heat controller to account for these variables as changes in the level of liquid are continuously monitored, that approach is complex and fails to eliminate the need for some degree of level control to prevent complete depletion or flooding. Vaporization rate also defines the headspace present above and within the bubbler container, which has been found to negatively effect the vapor concentration and ultimate bubbler performance when not optimized.

Inasmuch as vapor extraction from a fluid volume results in depleting the fluid volume of a bubbler, causing variations in vapor concentration, a means of replenishing this fluid is desirable. Some methods include manually replacing the bubbler ampoule once the volume of fluid reaches a predetermined minimum acceptable level. Other manual methods rely on an auxiliary supply of fluid to replenish the bubbler during intermittent periods of non-use. These systems rely on weight scales, sight glasses, ultra sonic detection, infrared or mechanical float systems. All of which have serious drawbacks. Such methods can result in reducing many of the concerns associated with prior art expendable bubblers, such as reducing the risk of contamination during ampoule replacement or any necessary fluid replenishment, but create a host of potential problems including metal fatigue, sealing of dissimilar materials, and need for calibration procedures. With many of the advanced processes running short cycle times, the opportunity to refill the liquid level must be very fast and accurate, typically less than 20 cc's of source material.

In addition to manual replenishment of fluid, automatic bubbler refill systems are also available. However, such systems typically employ float coupled electronic devices, such as level controllers, to control the replenishment of fluid in the bubbler. Such devices are prone to failure, or inaccuracies and are generally the most common failure mechanism in the system. Other types of fluid level sensors such as optical, load cell monitoring of the contents, and resistance probes have been employed. However, the use of such devices can be costly, prone to error, and with many of the fluids being flammable, represent ignition sources if not properly rated and maintained. The corrosive and toxic nature of the materials commonly encountered greatly limit the materials and construction of sensors used in these demanding applications.

U.S. Pat. No. 4,235,829, which issued on Nov. 25, 1980 to Fred P. Partus is noted. In it, there is shown a liquid vapor delivery system, which comprises a deposition bubbler adapted to generate and to deliver vapor from a liquid contained therein and in a reservoir in fluid communication with the bubbler. Facilities are provided for sensing the level of the liquid contained within the bubbler and for providing gaseous head pressures in the reservoir of magnitudes dependent upon the sensed liquid level. The liquid level in the bubbler drops as liquid is vaporized and withdrawn from the bubbler whereupon the level is adjusted by increasing the pressure head in the reservoir to feed liquid to the bubbler. Although the system works well, perturbations in the deposition bubbler caused by a drop in liquid level and then a rise due to the changing of the pressure in the reservoir can to an extent affect adversely the rate of vaporization and hence the concentration level of the vapor. These level changes are increased as the rate of deposition and hence the rates of withdrawal of vapor are increased.

Additionally, commonly assigned U.S. Pat. No. 4,276,243, which issued on Jun. 30, 1981 to Fred P. Partus, discloses a similar liquid vapor delivery system, which utilizes the temperature of the liquid as the characteristic to be monitored and manipulated to control the concentration level at the desired value. However, while this system is effective, the slow rate at which the overall temperature of the liquid can be changed, particularly cooled, often results in an unwanted delay in achieving the desired concentration level corrections.

Accordingly, it is to the task of maintaining a substantial constant level of liquid within a bubbler while vapors from the liquid are being continuously or intermittently withdrawn to which the present invention is generally directed. More particularly, the invention is directed to level control systems and methods for use in vaporizing highly corrosive liquids which may easily become contaminated if brought into direct contact with materials of the type used in conventional level controllers such as floats and the like.

SUMMARY OF THE INVENTION

The foregoing problems have been overcome by the method and system of the present invention. In accordance with the present invention, a method and system is described for controlling the delivery of vapor from a bubbler containing a supply of chemical fluid or reagent through which a carrier gas is bubbled and from which bubbler vapors are delivered in a vapor stream entrained with the carrier gas. In general, the present invention involves adjusting the pressure within the headspace of the bubbler to that of the chemical fluid level line, thus creating a repeatable fluid level based on pressure and fluid dynamics and not relying on conventional level sensors and controllers.

In one form of the invention a liquid vapor delivery system is provided which comprises a bubbler adapted to generate and to deliver vapors from a vaporizable chemical fluid contained therein, and a reservoir in fluid communication with the bubbler from which liquid may be appropriately fed into the bubbler to replenish liquid vaporized within and withdrawn from the bubbler. The system further comprises means for equilibrating the pressure within the headspace of the bubbler to that of the pressure within the liquid source tube connected to the bulk supply reservoir.

In another form of the invention, the bubbler floor is adapted to drain all liquid or reagents out of the bubbler through the liquid source line thus allowing for ease in cleaning.

Additional objects, advantages, and novel features of this invention shall be set forth in part in the description and examples that follow, and in part will become apparent to those skilled in the art upon examination of the following or may be learned by the practice of the invention. The objects and the advantages of the invention may be realized and attained by means of the instrumentalities and in combinations particularly pointed out in the appended claims.

BRIEF DESCRIPTION OF THE DRAWINGS

The accompanying drawings, which are incorporated in and form a part of the specifications, illustrate the preferred embodiments of the present invention, and together with the description serve to explain the principles of the invention.

In the Drawings.

DETAILED DESCRIPTION OF THE PREFERRED EMBODIMENT

Figure 1:
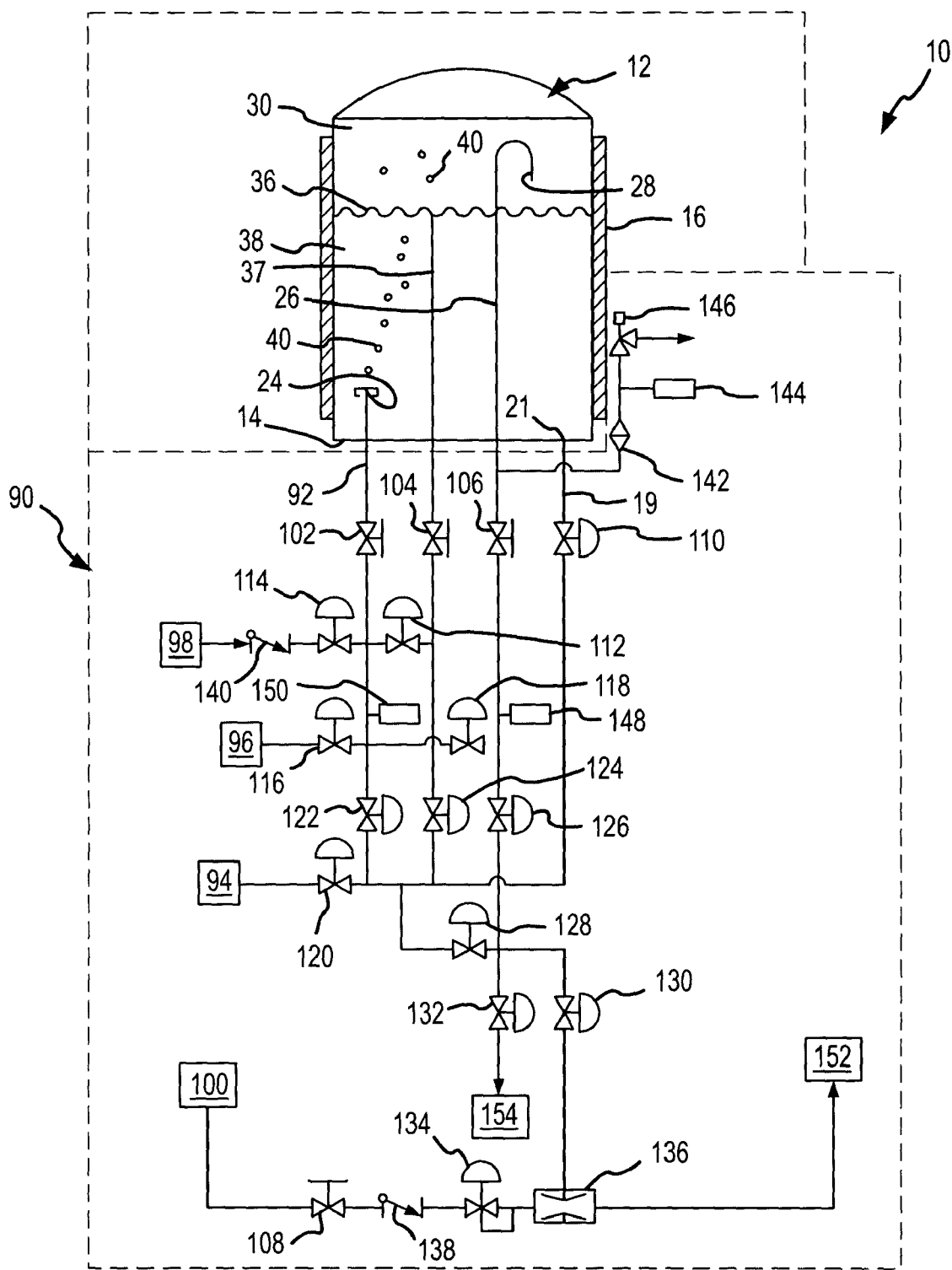
FIG. 1 is a schematic diagram of a preferred embodiment of a liquid vapor delivery system embodying the principles of this invention.

The liquid vapor delivery system 10 according to the present invention is best seen in FIG. 1. The liquid vapor delivery system 10 is designed to provide a vapor stream of an easily vaporizable liquid or reagent 38 which is contained in a reservoir 94 and in a bubbler 12. In general, the present invention involves adjusting the pressure within the headspace of bubbler 12 to that of the chemical fluid level line 37, thus creating a repeatable fluid level based on pressure and fluid dynamics and not relying on conventional level sensors and controllers. This is accomplished in two stages. During the first stage, all inlets and outlets of the bubbler 12 are set in a closed position except valves 102, 104 and 106. To begin the refill cycle, valves 120 and 110 are then opened to initiate the flow of liquid 38 from liquid source 94 to the bubbler 12. The system, during the refill cycle, allows over-filling of the liquid level 38 in bubbler 12 to a level controlled by the pressure of the liquid delivery conduit 19, thereby compressing the volume of vapor in bubbler 12 and creating a pressure approximating the liquid source line 19. Construction and placement of vapor extraction tube 28 prevents liquid from being forced into it. During the second stage, valve 110 is closed, pressure supply is removed from the liquid source 94, and valve 124 is opened forcing excess liquid through liquid level set tube 37 back to bulk liquid source 94.

Liquid delivery system 10 can be essentially viewed as having two major components, bubbler 12 and conduits system 90. When compared to traditional bubblers, bubbler 12 constitutes an upside down design in that all of the gas and liquid conduits that communicate with bubbler 12 are attached to bubbler floor 14. This design arrangement of bubbler 12 led to an unexpected capability of cleaning bubbler 12 in-situ. Bubbler floor 14 is designed so that the lowest point occurs at opening 21 which is attached to liquid source line or conduit 19. Thus, bubbler 12 can be readily cleaned in-situ without removing, disassembly, or contamination to the atmosphere. Cleaning is simply accomplished by closing all valves except valves 110, 128 and 130. Vacuum generator 136 is activated and reagent 38 is withdrawn through vent 152. Alternatively valve 132 may be opened to withdraw reagent 38. Valves 128 and 130 are then closed and a cleaning solvent (not shown) can be attached to conduit 19, in place of reservoir 94, and cleaning solvent may then be introduced into bubbler 12. Once cleaned, the cleaning solvent is then withdrawn from bubbler 12 as discussed previously in the case of reagent 38. Conduit system 90 essentially comprises a liquid source line 19, vapor stream conduit 26, level set line 37 and carrier gas conduit 92 all of which allow for fluid communication between bubbler 12 and carrier gas source 98, liquid reagent source reservoir 94 and a vacuum system that comprises a vacuum generator 136, purge gas supply 96, vacuum generator supply 100 and vent 152. It will be readily apparent to one of skill in the art that conduit system 90 would take on many permutations by simply changing the configuration of the valves consequently FIG. 1 is exemplary of one configuration that will accomplish the methods of the present invention.

As discussed previously, bubbler 12 communicates with a fluid reagent source reservoir 94 by way of conduit 19. Reservoir 94 is designed to maintain a large supply of ultrahigh purity chemical reagent 38 which is used to periodically replenish bubbler 12, preferably after every run. Reservoir 94 may simply be in the form of a carboy, but it will be understood that specially designed refill reservoirs may be required. Any kind of reservoir 94 which is chemically inert to the contained reagent 38, and which can be suitably connected to a conduit system for carrying reagent 38 to bubbler 12 may be used. Carrier gas intake conduit 92 extends from a source of pressurized carrier gas 98 into a flow controller unit 114. After passing through the flow controller unit 114 conduit 92 is directed into bubbler 12 terminating with a lower outlet or orifice 24 located in the bottom of bubbler 12. A vapor stream conduit 26 extends downwardly from a unshaped neck intake orifice 28, located in the headspace 30 in the top of bubbler 12, through a number pneumatic valves to the process tool 154. Level set line 37 is placed within bubbler 12 so that excesses reagent 30 can be dismissed from bubbler 12 as the head pressure is set. Furthermore, level set line 37 is adapted so that its height within bubbler 12 can be adjusted thus allowing one to set the depth of reagent 38.

A typical operation of the system 10 is now described as merely exemplary of the invention. It will be understood that the precise sequence and mode of operation may vary somewhat, depending upon the type of treatment zoned or furnace, which is being fed, and upon the kind of product being produced. Thus, the following description is merely exemplary.

Considering the invention as designed to provide a stream of carrier gas 98, which is either, saturated or partially saturated with reagent 38 to a processing tool 154, the overall flow of gases and fluids will be as described. Taking the system 10 at an equilibrium operating state, with the processing tool 154 in operation, the flow of gases is as follows. Carrier gas 98 which may be an inert gas, such as and but not limited to argon, helium, oxygen, nitrogen or hydrogen is contained within a cylinder from which it flows through conduit system 92 thereby being introduced through orifice 24 into reagent 38 contained within bubbler 12. Bubbler 12 includes a heater/chiller 16 which for example may be a strap heater that is jacketed about an outer surface of bubbler 12. The heater/chiller 16 is used to provide energy to increase or decrease the temperature and to vaporize reagent 38 in bubbler 12.

As carrier gas 98 travels up through reagent 38, it becomes either saturated, or partially saturated, depending upon the rate of flow, the depth of reagent 38, the temperature, etc., with reagent 38. Reagent-ladened gas 40 then flows into headspace 30 and out vapor stream conduit 26, which is connected to process tool 154. Vapor stream conduit 26 is u-shaped so that as gas bubbles 40 break the surface 36 of reagent 38 splattered fluids will not drop down into inlet tube 26. There may be provided, in addition to this gas flow, other streams. For example, other streams of inert gas, or reactive gas, or reagents, may also be provided. These are not part of this invention, however, and would be provided separately and independently of this invention, depending upon the precise reaction that was desired to be carried out.

The system, as thus described, may be considered the equilibrium system. During the period of time process tool 154 is in a deposition mode, the reagent-laden gas 40 is being provided to processing tool 154, and the fluid level 36 is decreasing an extremely small percentage of total bubbler volume. Consequently, after each run the refill cycle is activated. As discussed previously all inlets and outlets of bubbler 12, as shown in FIG. 1, are switched into a closed position except valves 102, 104 and 106. To begin the refill cycle, valves 120 and 110 are then opened to initiate the flow of reagent 38 from reservoir 94 to bubbler 12. Alternatively, valves 120 and 122 or 124 may be opened to fill bubbler 12. The system, during refill cycle, allows over-filling of the liquid level in bubbler 12 to a level controlled by the pressure of the liquid delivery conduit 19, thereby compressing the volume of vapor in the bubbler and creating a pressure approximating the liquid source line 19. Construction and placement of vapor extraction tube 28 prevents liquid from being forced into it. During the second stage, valve 110 is closed, pressure supply is removed from reservoir 94, and valve 124 is opened forcing excess liquid within bubbler 12 out through fluid level set line 37 back to bulk liquid source 94. The length of the refill cycle is thus dependent on the total bubbler volume. During filling sequence, pressure in the head space 30 is dependent upon the pressure of conduit 19, reagent 38 will automatically flow from reservoir 94 into bubbler 12 until the pressure in head space 30 equilibrates with that of conduit 19. Thus the level of reagent 38 in bubbler 12 is replenished to an overfilled state, in preparation for the leveling sequence described earlier.

Once the liquid pressure in bubbler 12 reaches an equilibrium state, a valve is closed to liquid flow, and is opened to gas flow, thus flushing out of the conduit system all of the liquid reagent. This provides important safety protection, since the liquid is maintained in the conduit system 90 only during the refill cycle, and, also, minimizes contamination since the reagent is not held in the conduit system, which has large surface area exposure. The conduit system 90 is maintained at a positive pressure with inert gas. Because the principle of operation works on pressure differences, not absolute pressures we can easily deliver very low pressure fluids and much higher pressure condensed fluids. The absolute vapor pressure of the fluid we are trying to deliver is not so critical as it is in other conventional bubblers.

Once bubbler 12 is refilled, the valve returns to its operating position. Inert gas from conduit 92 flows through the inlet bubbler tube 24, through the outlet tube 26 and to processing tool 154 as previously described.

In a highly unique and novel arrangement, the system includes means including a conduit system 90 for transferring vapor or liquid reagent 38 during a first time period from the refill reservoir 94 through the conduit system 90 into the bubbler 12, flushing reagent 38 out of the conduit system 90, filling the conduit system 90 with inert gas, and maintaining a predetermined pressure of inert gas in said conduit system 90 between the periodic transfer of reagent 38 there through, a substantially gas tight enclosure for the refill reservoir 94 and means for providing inert gas 98 at a predetermined pressure to the enclosure to maintain the refill reservoir in an inert atmosphere, and may also include means for providing inert gas 98 at a predetermined pressure and rate to the refill reservoir, and means for feeding a stream of inert gas into bubbler 12 to be at least partially saturated with chemical fluid only during a second time period, the first and second time periods alternating with time.

In the embodiment shown in FIG. 1, optional heater/chiller 16 may be added to control the temperature of the liquid in the supply and deposition bubbler 12, respectively, to vaporize liquid therein.

Figure 2:
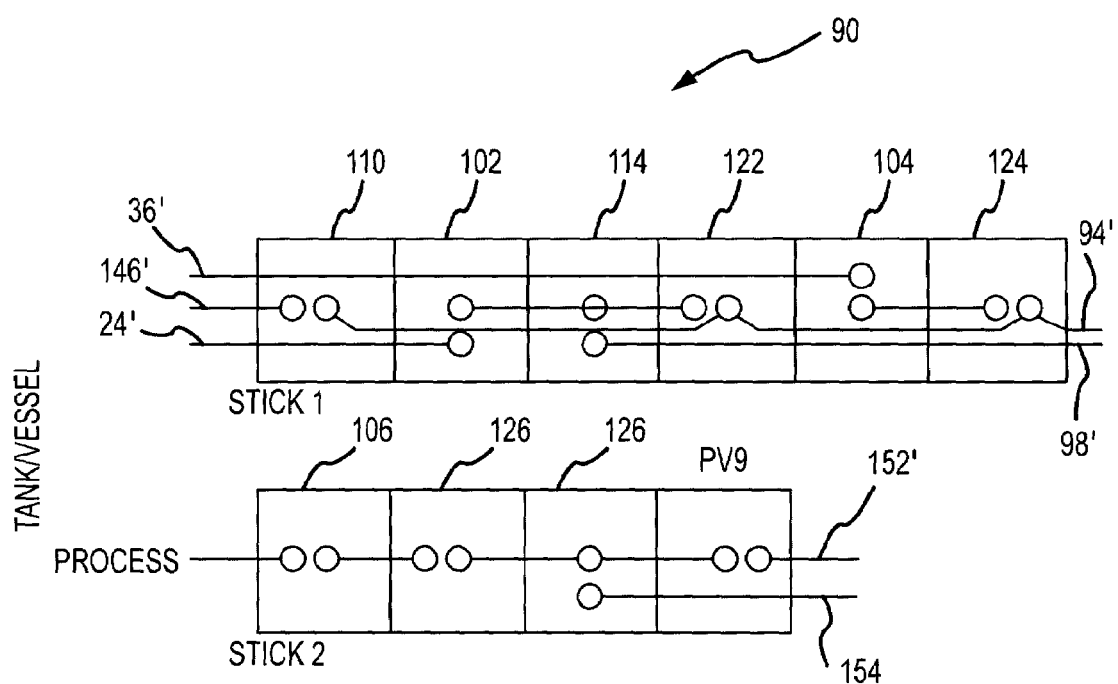
FIG. 2 is a schematic diagram of the top plan view of the modular fluid-handling unit used in the liquid vapor delivery system of this invention.

A modular fluid handling assembly, shown in FIG. 2 and similar to that disclosed in U.S. Pat. No. 6,298,881 which is incorporated herein by reference, includes a plurality of fluid handling units. Each fluid handling unit includes a fluid passage and associated port, a vacuum passage and associated port, a vacuum pressure source, and a containment seal. The fluid passage ports and vacuum passage ports of adjacent fluid handling units respectively communicate. The containment seal is disposed between adjacent fluid handling units and surrounds the communicating fluid passage ports and vacuum passage ports. The vacuum pressure source is in continuous communication with the vacuum passages of the fluid handling units, generates an urging force, which aids in sealing adjacent fluid handling units together, and draws off any fluid that may leak from a fluid passage port. A sensor can be tapped into the vacuum line to sense whether any fluid has leaked from a fluid passage port.

It is to be understood with respect to the enclosed conduit system, which comprises both the conduit and valving enclosed in suitable gas tight, or substantially gas tight enclosure mechanisms, and filled with inert gas, that the specific configuration, construction and operation of the valve is of secondary significance, and any valve may be used. What is significant is that the entire conduit system, or a substantial portion of the conduit portion, sufficient to protect the conduit system and prevent contamination through the walls of the conduit system, is enclosed in one or more envelopes filled with inert gas.

The foregoing description is considered as illustrative only of the principles of the invention. The words "comprise," "comprising," "include," "including," and "includes" when used in this specification and in the following claims are intended to specify the presence of one or more stated features, integers, components, or steps, but they do not preclude the presence or addition of one or more other features, integers, components, steps, or groups thereof. Furthermore, since a number of modifications and changes will readily occur to those skilled in the art, it is not desired to limit the invention to the exact construction and process shown described above. Accordingly, all suitable modifications and equivalents may be resorted to falling within the scope of the invention as defined by the claims, which follow.

The embodiments of the invention in which an exclusive property or privilege is claimed are defined as follows:

1. An apparatus for controlling the delivery of vapor to a process tool, said apparatus comprising:
   a bubbler defining an interior for containing a quantity of a reagent and which is in fluid communication with a process tool;
   means for introducing a carrier gas into said bubbler interior to cause vapor of said reagent to become entrained in said carrier gas and to flow out of said bubbler to a process tool; and
   control means for maintaining sufficient liquid within said bubbler, the control means comprising a liguid level tube extending through a bottom of the bubbler into the bubbler interior such that a top of the liguid level tube is positioned at a predetermined height to achieve during refilling of the bubbler a head pressure in the bubbler interior such that the top of the liguid level tube and an upper surface of the reagent substantially coincide.

2. The apparatus of claim 1, wherein said control means causes the concentration level of the delivered vapor to be substantially constant.

3. The apparatus of claim 1, further comprising a heating means for increasing the temperature of said reagent in said bubbler.

4. The apparatus of claim 1, which also includes a reservoir for holding a quantity of said reagent and a conduit which includes a valve and which provides liquid communication between said reservoir and said bubbler, and wherein said control means includes means for providing a gaseous head pressure within said bubbler.

5. The apparatus of claim 4, wherein levels of said reagent in said bubbler are set between limits which define a sufficient quantity of reagent are established, and wherein when said reagent levels rise or drop to said predetermined levels, said valve is closed or opened automatically to discontinue or to begin filling said bubbler until the head pressure with said bubbler equilibrates with the pressure of said conduit.

6. An apparatus for providing chemically reactive vapor to a processing tool, comprising:
   a bubbler for containment of a reagent that is in communication with a reservoir containing said reagent, a carrier gas and a processing tool, wherein said bubbler comprises a carrier gas outlet, a liquid level set tube, a vapor extraction tube, and a drain placed in a low point of the bubbler floor, wherein the top of said liquid level set tube is positioned at a predetermined height to achieve a specific head pressure within said bubbler resulting in the surface of said reagent to be level with the top of said liquid level set tube and wherein said vapor extraction tube has a first end that is substantially u-shaped and that is positioned above and horizontal to said reagent surface and a second end in communication with said processing tool.

7. The apparatus of claim 6, wherein said liquid level set tube of said bubbler is in fluid communication with a reservoir containing a chemical reagent, the bubbler further comprising a gas carrier intake conduit connected to the chemical reagent reservoir and having a portion extending through the bubbler floor to a point a distance above the bubbler floor.

8. The apparatus of claim 6, wherein the liquid level set tube is selectively positionable to adjust the predetermined height of the top of said liquid level set tube in the bubbler.

9. The apparatus of claim 1, further comprising means for extracting vapor from the bubbler interior, the vapor extracting means comprising a tube with a U-shaped portion with an opening for receiving vapor that is positioned in the bubbler interior above the top of the liquid level tube.

10. The apparatus of claim 1, further comprising a reagent fill and drain line connected to the bottom of the bubbler such that an opening in the reagent fill and drain line does not protrude above a surface of the bottom of the bubbler.

11. The apparatus of claim 10, further comprising a source of the reagent, wherein the liquid level tube and the reagent fill and drain line are selectively connected to the source of the reagent, wherein the apparatus further comprises means for, during a first stage of the refilling of the bubbler, connecting the reagent source to the reagent fill and drain line during a first stage and disconnecting the liquid level tube from the reagent source and for, during a second stage of the refilling of the bubbler, connecting the liquid level tube from the reagent source and disconnecting the reagent fill and drain line from the reagent source.

12. A bubbler for providing chemically reactive vapor to a processing tool, comprising:
   a vessel for containing a reagent and a carrier gas, the vessel comprising a side wall, a bottom, and a top, wherein an inner surface of the side wall, the bottom, and the top define an interior space of the vessel;
   a carrier gas outlet extending into the interior space of the vessel;
   a vapor extraction tube extending into the interior space of the vessel;
   a reagent fill and drain line with an opening in the bottom of the vessel; and
   a liquid level tube passing through the bottom of the vessel and extending from the bottom of the vessel into the interior space of the vessel, wherein the liquid level tube has an end positioned at a predetermined distance from the inner surface of the bottom to achieve a specific head pressure within interior space of the vessel resulting in a surface of the reagent contained in the vessel to be level with the opening of said liquid level tube.

13. The bubbler of claim 12, wherein said vapor extraction tube extends through the bottom of the vessel and comprises a substantially U-shaped end with an opening for receiving vapor facing the bottom of the vessel, the vapor extraction tube being positioned with the opening of the U-shaped end above the end of the liquid level tube.

14. The bubbler of claim 12, wherein the liquid level set tube is selectively positionable to adjust the predetermined height of the end of said liquid level set tube in the interior space relative to the inner surface of the bottom of the vessel.

15. The bubbler of claim 12, wherein the liquid level tube and the reagent fill and drain line are selectively connected to a source of the reagent, wherein the bubbler further comprises means for, during a first stage of the refilling of the bubbler, connecting the reagent source to the reagent fill and drain line during a first stage and disconnecting the liquid level tube from the reagent source and for, during a second stage of the refilling of the bubbler, connecting the liquid level tube from the reagent source and disconnecting the reagent fill and drain line from the reagent source.

* * * * *